US010411690B2

(12) United States Patent
Mathad

(10) Patent No.: US 10,411,690 B2
(45) Date of Patent: Sep. 10, 2019

(54) LOW SIDE OUTPUT DRIVER REVERSE CURRENT PROTECTION CIRCUIT

(71) Applicant: Texas Instruments Incorporated, Dallas, TX (US)

(72) Inventor: Jayateerth Pandurang Mathad, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 178 days.

(21) Appl. No.: 15/434,178

(22) Filed: Feb. 16, 2017

(65) Prior Publication Data

US 2017/0264281 A1 Sep. 14, 2017

(30) Foreign Application Priority Data

Mar. 8, 2016 (IN) ............................. 201641007996

(51) Int. Cl.
*H03K 17/081* (2006.01)
*H03K 19/017* (2006.01)
*H03K 19/0175* (2006.01)

(52) U.S. Cl.
CPC ............... *H03K 17/08104* (2013.01); *H03K 19/017509* (2013.01); *H03K 2217/0072* (2013.01)

(58) Field of Classification Search
CPC ..... H03K 17/08104; H03K 19/017509; H03K 2217/0072

See application file for complete search history.

(56) References Cited

U.S. PATENT DOCUMENTS

| 6,781,805 B1* | 8/2004 | Urakawa ............. H01L 27/0251 361/111 |
| 9,490,244 B2* | 11/2016 | Barrenscheen ..... H01L 27/0266 |
| 9,520,789 B2* | 12/2016 | Iwamizu ............. H02M 3/1588 |
| 2006/0033551 A1 | 2/2006 | Dong et al. |
| 2007/0014064 A1* | 1/2007 | Souma ............... H03K 17/0822 361/91.7 |
| 2008/0265952 A1 | 10/2008 | Rincon-Mora et al. |

OTHER PUBLICATIONS

"TRS3122E 1.8 V Low Power Dual RS-232 Transceiver", Texas Instruments, TRS3122E, SLLSET7C—May 2016—Revised May 2016, 28 pgs.

* cited by examiner

*Primary Examiner* — Scott Bauer
(74) *Attorney, Agent, or Firm* — Lawrence J. Bassuk; Charles A. Brill; Frank D. Cimino

(57) ABSTRACT

Disclosed examples include integrated circuits, output driver circuits and protection circuits to protect an output transistor connected between a driver output node and a first intermediate node, including a resistor connected between the output node and a gate terminal of the output transistor, a diode connected between a second intermediate node and the output transistor gate terminal, and a switching device to electrically couple the second intermediate node with a reference node to turn on the output transistor to allow a second transistor to control a voltage of the output node when a control signal is in a first state, and to disconnect the second intermediate node from the reference node to prevent current flow through the resistor to control a gate voltage of the output transistor when the control signal is in a different second state.

19 Claims, 5 Drawing Sheets

LOW SIDE OUTPUT DRIVER REVERSE CURRENT PROTECTION CIRCUIT

REFERENCE TO RELATED APPLICATION

This application claims priority to, and the benefit of, Indian provisional application number 201641007996, entitled "Reverse current protection circuit for Low-side of an Output Driver", and filed in India on Mar. 8, 2016, the entirety of which is hereby incorporated by reference.

BACKGROUND

Driver circuits are used in a variety of applications, including telecommunications and industrial systems to transmit data signals. Driver integrated circuits or ICs often provide one or more transmit driver circuits as well as receiver circuitry to receive incoming data from the network. When the driver circuitry powered down or disabled, the driver output may be subject to positive and/or negative voltage stresses beyond the normal operating voltage levels. These stress voltage levels, moreover, may exceed the rating of output transistors connected to the driver output. In addition, many design specifications have maximum sourcing and sinking leakage current requirements for driver outputs in the presence of potentially large positive or negative voltages when the circuit is powered down.

SUMMARY

Disclosed examples include driver ICs and circuits with circuitry to protect driver output transistors and limit leakage current when the driver is disabled, while allowing proper driver functionality when the circuit is enabled. Example protection circuits include a resistor connected between a driver output node and a gate terminal of the output transistor, along with a diode connected between a second intermediate node and the output transistor gate terminal. A switching device electrically couples the second intermediate node with a reference node to turn on the output transistor to allow a second transistor to control a voltage of the output node when a control signal is in a first state for normal transmitter operation. The switching device disconnects the second intermediate node from the reference node to prevent current flow through the resistor to control the output transistor gate voltage when the control signal is in a different second state.

DETAILED DESCRIPTION

Figure 1:
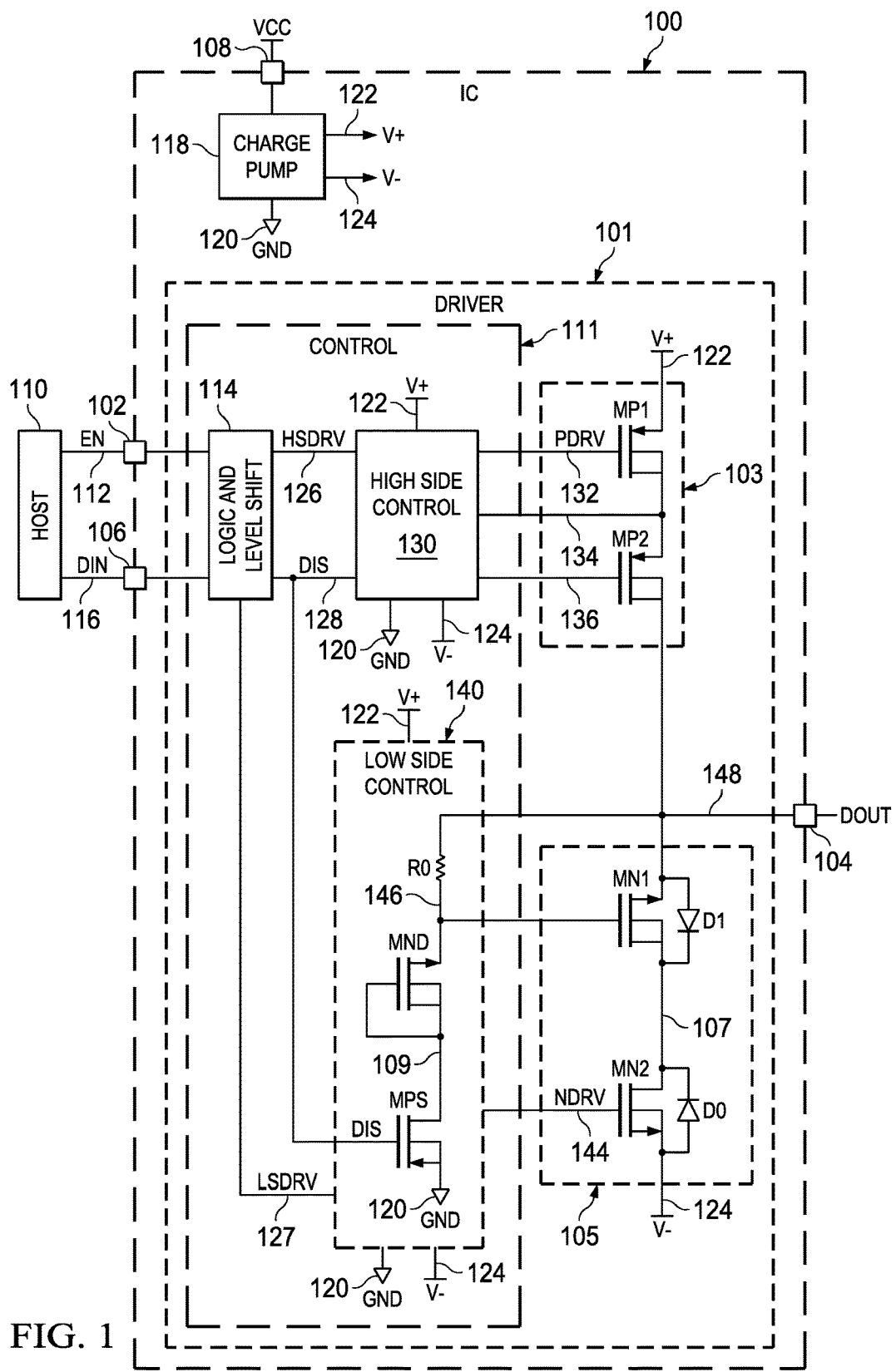
FIG. 1 is a schematic diagram of a communications driver integrated circuit including circuit to protect an output driver transistor and mitigate reverse current according to an embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " In addition, the terms "couple", "coupled" or "couples" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
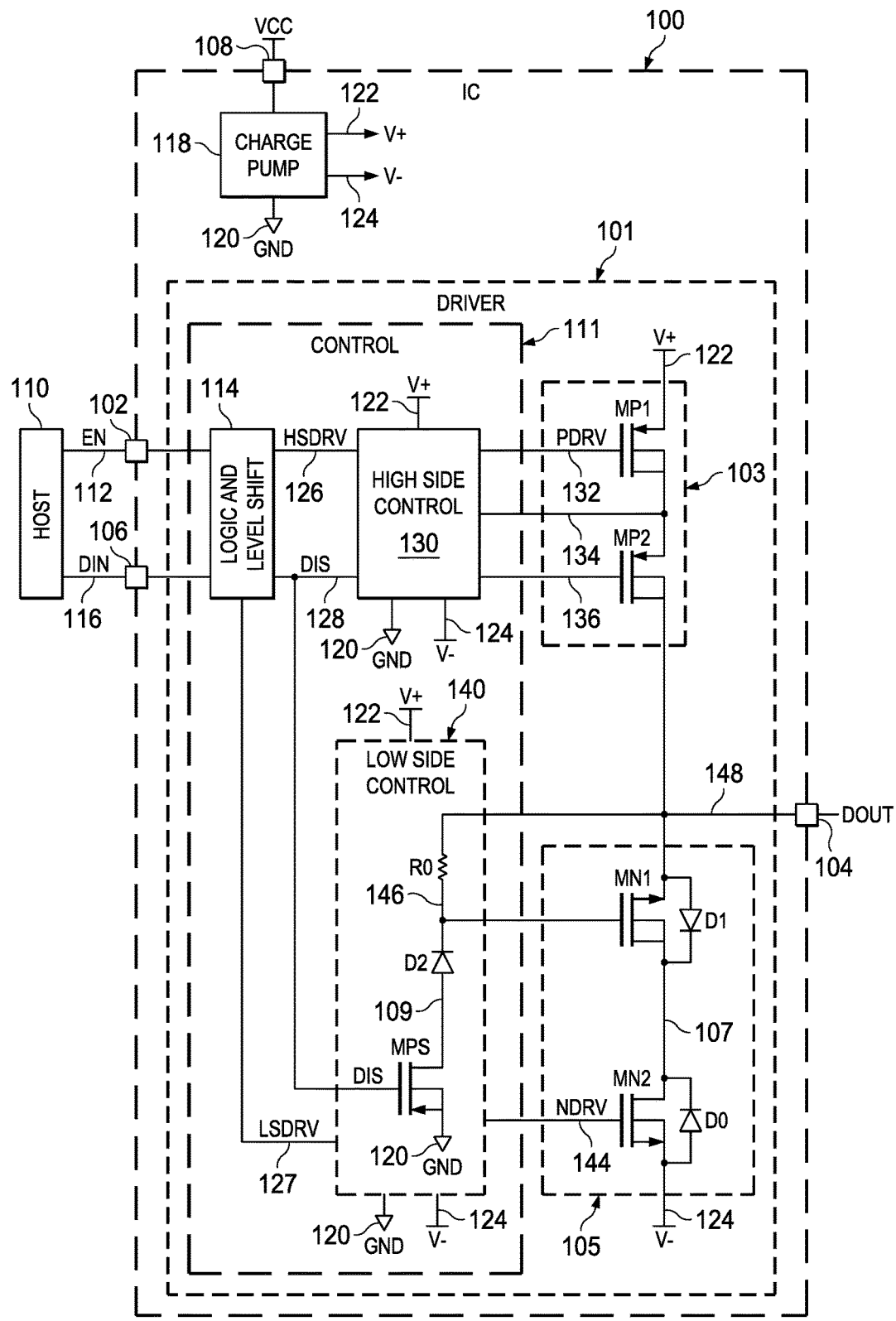
FIG. 2 is a schematic diagram of a communications driver IC according to another embodiment.

FIGS. 1 and 2 show embodiments of a driver IC 100 including an output driver circuit 101. The IC 100 in FIG. 1 includes a control input terminal 102 that receives an enable signal EN along a corresponding input line 112 from a host circuit 110. The IC 100 further includes an output terminal 104 that provides a data output signal DOUT from an output node 148 according to a data input signal DIN received at a data input terminal 106 along a line 116. The enable signal EN allows the host circuit 110 to place the driver IC 100 in a first mode (normal mode) for transmitting data at the output terminal 100 for, as well as a second mode (disabled). In normal operation, the voltage at the data output terminal 104 is controlled by selective operation of a high side switch circuit 103 coupled between the output terminal 104 and a first supply node 122 having a first supply voltage V+. A low side switch circuit 105 coupled between the output terminal 104 and a second supply node 124 having a second supply voltage V−. The IC 100 further includes a power input terminal 108 connected to an external supply voltage VCC. In one example, the supply voltage VCC can be 1.8 V or 3.3 V. Any suitable supply voltage VCC can be used in other embodiments. A charge pump circuit 118 receives the supply voltage VCC and generates the first and second supply voltages V+ and V− at the first and second supply nodes 122 and 124, respectively, relative to a reference node 120 having a corresponding reference voltage GND between the first and second supply voltages V+ and V−. In one example, the first supply voltage V+ is approximately 5.5 V and the second supply voltage V− is approximately −5.5 V relative to the reference voltage GND. Other supply voltages can be used in which the second supply voltage V− is lower than the first supply voltage V+, and the reference voltage GND is between the first and second supply voltages V+ and V−. The illustrated example can be used, for example, as an RS-232 driver circuit providing an output signal having a range of approximately +/−5.5 V. The IC 100 can include further terminals (not shown), for example, to allow connection of external capacitors associated with the charge pump circuit 118.

The driver circuit 101 further includes a control circuit 111 that receives the enable signal EN and the data input signal DIN from the host circuit 110. The control circuit 111 includes a logic and level shift circuit 114 connected to the lines 112 and 116 to receive the EN and DIN signals. In one example, the host circuit 110 is a processor or logic circuit that provides the signals EN and DIN at approximately 0 V in one state or at a level of the supply voltage VCC and a different state. The logic and level shift circuit 114 receives these signals EN and DIN and provides corresponding signals at shifted levels referenced to the voltage GND of the reference node 120. In one example, the host circuit 110 provides the enable signal EN in a first state of approximately 0 V to enable the driver circuit 101, and in a second state of approximately 1.8 V or 3.3 V (e.g., at the level of VCC) to disable the driver circuit 101. The level shift circuit 114 includes a high side drive output 126, which provides a signal HSDRV to a high side control circuit 130, and a low side drive output 127, which provides a signal LSDRV to a low side control circuit 140.

The circuit 114 includes a control output 128 that provides a control signal DIS to the high and low side control circuits 130 and 140. In one example, the level shift circuit 114 provides the control signal DIS in a first state (e.g., −5.5 V) for normal operation to operate the high and low side switch circuits 103 and 105 to selectively couple the output node 148 to one of the first and second supply nodes 122 or 124 according to the data input signal DIN when the enable input signal EN is in a first state (e.g., logic low having a level of 0 V). To disable the switch circuits 103 and 105, the control circuit 128 provides the control signal DIS in a different second state (e.g., logic high having a voltage of 0 V relative to the reference voltage GND to disable the high and low side switch circuits 103, 105 when the enable input signal EN is in the second state. In addition, the logic and level shift circuit 114 generates the high and low side signals HSDRV and LSDRV in normal operation according to the data input signal DIN in generally complementary fashion to transmit the data output signal DOUT to a destination device or system connected to the output terminal 104.

Figure 3:
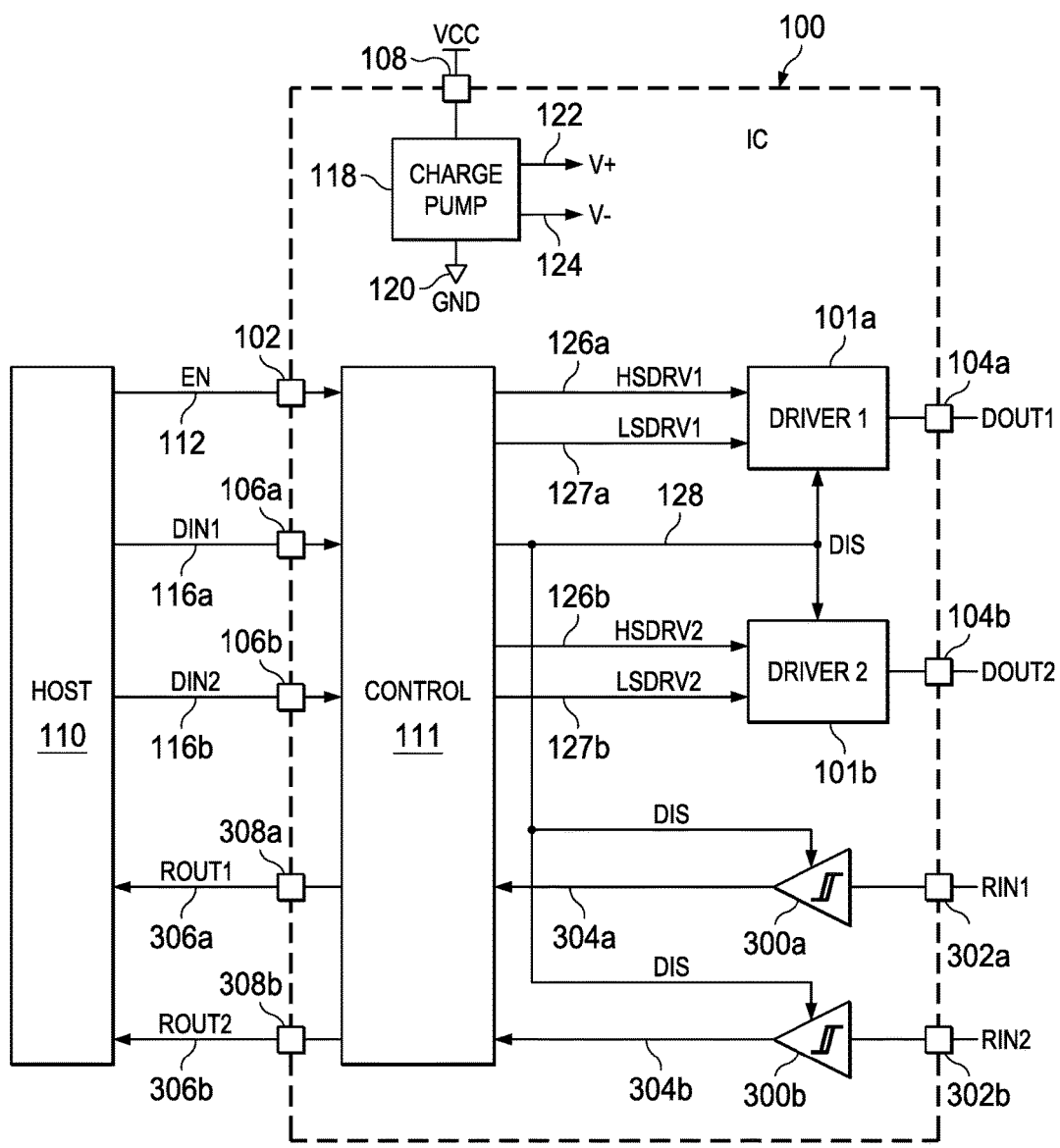
FIG. 3 is a schematic diagram of a multi-channel communications interface IC embodiment with two output driver channels and two receive channels.

FIG. 3 shows a multi-channel communications interface IC embodiment 100 with two output driver channels and two receive channels. In this example, each of the driver circuits 101a and 101b is implemented as a separate driver circuit 101 as shown in FIG. 1 or FIG. 2. In this case, the charge pump circuit 118 provides first and second supply voltages V+ and V− (e.g., +/−5 V) relative to a voltage GND at a reference node 120 as previously described. The host circuit 110 (e.g., a processor) provides first and second data output signals DIN1 and DIN2 to corresponding data input terminals 106a and 106b on data lines 116a and 116b connected to a control circuit 111. The control circuit 111 includes two sets of high and low side control circuits 130, 140 as shown in FIG. 1 to provide high and low side driver signals to the respective driver circuits 101a and 101b. In particular, the control circuit 111 includes a drive signal output 126a that provides a signal HSDRV1 to the driver 101a, and an output 127a that provides a signal LSDRV1 to the driver 101a. In addition, a control output 126b provides a signal HSDRV2 to the driver 101b, and an output 127b provides a signal LSDRV2 to the driver 101b. The first driver provides a corresponding data output signal DOUT1 at an output terminal 104a, and the second driver 101b provides a data output signal DOUT2 at a second output terminal 104b. The control circuit 111 also provides a disable control signal DIS to the transmit drivers 101a and 101b at an output 128 according to an enable signal EN received at the terminal 102 as described above. The interface IC 100 in FIG. 3 also includes two receive channels with corresponding receive input terminals 302a and 302b that receive corresponding input data signals RIN11 and RIN2, respectively. The receive signals are detected by receiver circuits 300a and 300b which can be enabled or disabled according to the DIS signal from the control circuit 111. The receiver circuits 300a and 300b in one example convert RS-232 signal levels to provide logic level signals to the control circuit 111 on outputs 304a and 304b, respectively. The control circuit 111, in turn, provides receiver output signals ROUT1 and ROUT2 on lines 306a and 306b for delivery to the host circuit 110 via receive terminals 308a and 308b, respectively.

Returning to FIGS. 1 and 2, the high side switch circuit 103 is coupled between the output terminal 104 and the first supply node 122. The circuit 103 includes a first PMOS transistor MP1 with a source connected to the first supply node 122, a drain connected to a node 134, and a gate connected to receive a positive drive signal PDRV at a control output 132 of the high side control circuit 130. The circuit 103 includes a second high side PMOS transistor MP2, having a source connected to the drain of MP1 at the node 134, a drain connected to the output node 148, and a gate connected to an output 136 of the high side control circuit 130. In operation, the control circuit 130 provides the PDRV signal at suitable first and second levels to selectively operate the transistor MP1 according to the high side drive control signal HSDRV from the logic and level shift circuit 114 during normal operation. In one example, the lower high side transistor MP2 is turned on during normal operation and acts as a protecting transistor when the driver circuit 101 is disabled. The transistor MP1 is selectively turned on according to the data input signal DIN to selectively couple the output node 148 with the first supply node 122 in order to generate a logic high signal at the output terminal 104 (e.g., DOUT approximately equal to V+).

The low side switch circuit 105 includes a first low side transistor MN1 connected between the output node 148 and a first intermediate node 107, and a second low side transistor MN2 connected between the first intermediate node 107 and the second supply node 124. In one example, the transistor MN1 is an NMOS transistor with a source connected to the output node 148, a drain connected to the first intermediate node 107, and a gate terminal 146 connected to the low side control circuit 140. The transistor MN1 includes a body diode shown as D1 in FIG. 1, with an anode connected to the output node 148 and a cathode connected to the intermediate node 107. In one example, the NMOS transistor MN1 is implemented in the IC 100 with a drain terminal implemented in a floating N-well (not shown). The second low side transistor MN2 in this example is also an NMOS transistor, including a source connected to the second supply node 124, a drain connected to the node 107, and a gate 144. The gate 144 of MN2 is connected to receive a low side data signal NDRV from the low side control circuit 144 based on the LSDRV signal from the logic and level shift circuit 114. MN2 has a body diode D0 with an anode connected to the supply node 124 and a cathode connected to the intermediate node 107. In normal operation when the enable input signal EN is in the first state (low), the first low side transistor MN1 operates as a blocking transistor and the second low side transistor MN2 operates as a pass transistor to selectively couple the output terminal 104 with the second supply voltage V− according to the data input signal DIN.

When the host circuit 110 disables the driver circuit 101, the charge pump 118 is also disabled, and the supply nodes 122 and 124 have a voltage of approximately 0 V relative to the voltage GND of the reference node 120. In this state, a protection circuit of the low side control circuit 140 protects the output transistor MN1 against overvoltage stresses, and limits the amount of sourcing and/or sinking leakage current flowing at the output terminal 104. The protection circuit includes a resistor R0 with a first terminal connected to the output terminal 104 and a second terminal connected to the gate 146 of MN1, as well as a diode MND and a switching device MPS connected in series between the gate 146 of MN1 and the reference node 120. In the example of FIG. 1, the diode is implemented as a diode-connected NMOS transistor MND, and the switching device is a PMOS transistor MPS. In the example of FIG. 2, the protection circuit diode is a traditional diode structure D2 with an anode connected to a second intermediate node 109 and a cathode connected to the gate 146 of the output transistor MN1. The switching device MPS operates according to the DIS signal to electrically couple the second intermediate node 109 with the reference node 120 to turn on the output transistor MN1 when the control signal DIS is in the first state (e.g., normal operation logic low, −5.5 V). During normal operation, the transistor MN1 provides a low impedance between its source and drain (low RDSON), and thus provides minimal voltage drop when the lower transistor MN2 is turned on. In this manner, the low side switching circuit 105 advantageously pulls the output voltage DOUT close to the second supply voltage V− when MN2 is turned on.

When the host circuit 110 provides the enable signal EN in a logic high state (e.g., 1.8 V or 3.3 V), the logic and level shift circuit 114 provides the DIS signal at the control output 128 at a logic high level (e.g., 0 V relative to the reference voltage GND). The DIS signal in one example also controls operation of the charge pump circuit 118. In this example, when the enable signal EN is logic high, the logic and level shift circuit 114 disables or turns off the charge pump circuit 118. This causes the first and second supply voltages V+ and V− to each go to a high impedance state with a voltage of 0 V (e.g., at the voltage GND of the reference node 120). In certain RS-232 and other driver applications, it is desirable to protect the output transistors of one or both of the high and low side switching circuits 103, 105 while the driver circuit 101 is disabled. Moreover, it is desirable to limit the sourcing and/or sinking leakage current during the disabled mode operation. In this mode, the switching device MPS is turned off and thus no current flows through the diode MND. The resistor R0 in one example is approximately 1 MΩ, and provides a gate to source connection of MN1. In one example, the output transistor MN1 has a gate-source voltage rating of approximately 7 V. The protection circuit provides a resistive connection between gate and source when the low side driver circuit 105 is disabled, which essentially maintains the gate voltage at the node 146 the same as the output voltage at the node 148. As a result, the output terminal 104 can experience potentially large positive or negative voltage levels, such as +/−12 V, but the gate-source voltage of the output transistor MN1 is protected against voltage stress by the protection circuit. In addition, the protection circuit ensures that MN1 is turned off when the driver circuit 101 is disabled (VGS is approximately 0 V), resulting in effective leakage current limiting. Consequently, the low side switching circuit 105 and the protection circuit will sink or source only very small amounts of leakage current when the host circuit 110 disables the driver circuit 101.

The illustrated protection circuit is shown in the low side control circuit 140 in FIGS. 1 and 2 to provide protection for the low side output transistor MN1 of the switching circuit 105. In certain embodiments, similar protection circuitry is provided in the high side control circuit 130 to protect the output transistor MP2 against voltage stress when the driver circuit 101 is disabled, and to limit leakage current to or from the high side switching circuit 103 in similar fashion.

Figure 4:
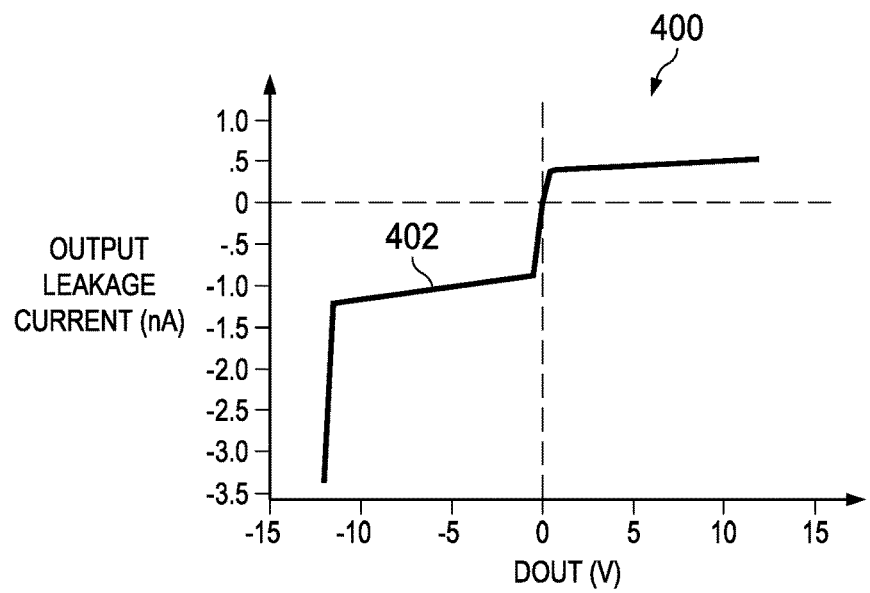
FIG. 4 is a graph showing simulated output leakage current in the driver IC of FIG. 1.

Referring also to FIG. 4, a graph 400 illustrates an example simulated output leakage current curve 402 showing leakage current levels for disabled-state output voltage levels varying between +/−12 V. Some RS-232 driver circuits and other driver circuit applications are often required to limit the leakage current to certain levels when the driver is disabled, and must protect the internal driver circuitry against voltage stresses for elevated output terminal voltages. For example, it is desirable in certain applications to ensure against output transistor damage or degradation for disabled-state output terminal voltages of +/−12 V, and to limit the disabled-state leakage current (sourcing or sinking) to less than +/−50 uA. As discussed above, the protection circuitry effectively controls the disabled-state gate-source voltage of the output transistor (e.g., MN1) to be approximately 0 V, and ensures that the disabled-state gate-drain voltage of MN1 is approximately 0 V. Thus, the protection circuitry of disclosed examples mitigates voltage stress damage or degradation to the output transistors and other circuitry of the driver circuit 101 during operation in the disabled mode. The simulated circuit performance in FIG. 4 further illustrates the leakage current limiting advantages of the protection circuit examples. In particular, the sourcing and/or sinking leakage current performance shown in the simulated curve 402 is less than +/−3.5 nA.

Figure 5:
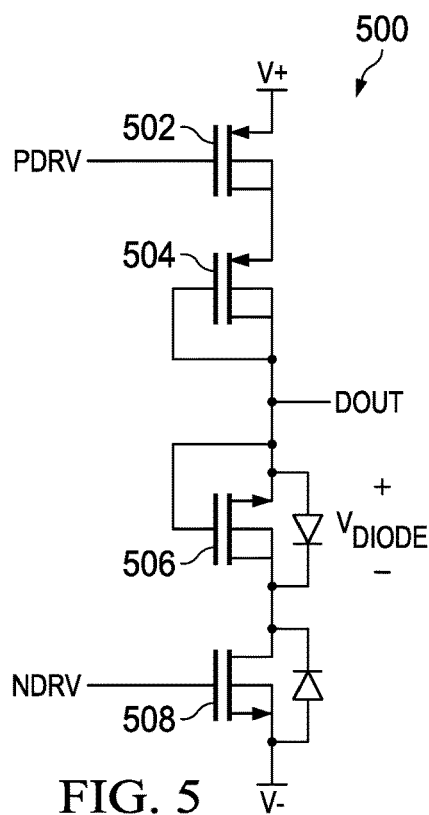
FIG. 5 is a schematic diagram showing driver output stage with high and low side driver circuits without protection circuitry.
Figure 6:
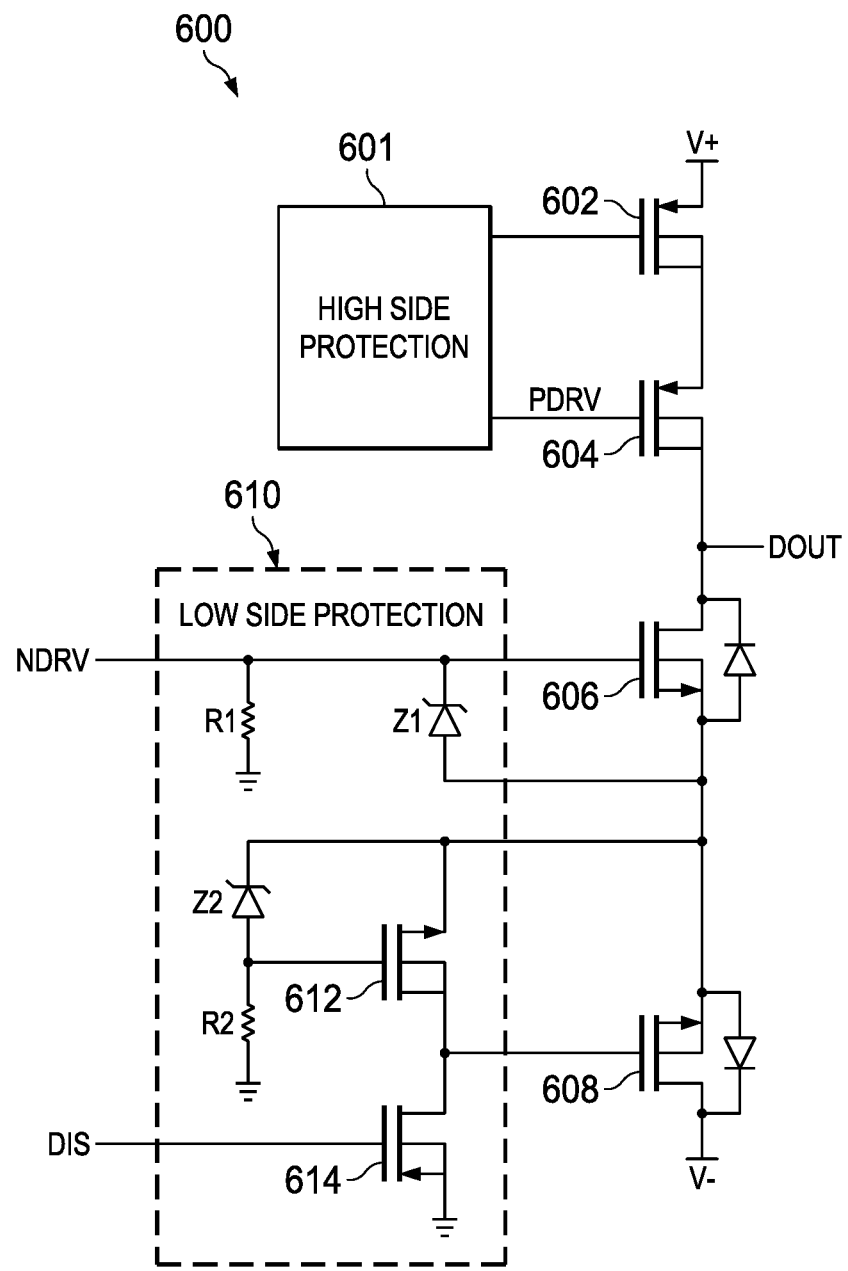
FIG. 6 is a schematic diagram of another driver output stage protection circuit using Zener diodes.

FIGS. 5 and 6 illustrate other output driver circuits 500 and 600 that address leakage current. The driver output circuit 500 in FIG. 5 includes two PMOS high side transistors 502 and 504 connected in series with one another between a positive supply voltage V+ and a data output, as well as two NMOS low side transistors 506 and 508 connected between the output and a negative supply voltage V−. The transistors 504 and 506 are diode-connected to block reverse current flow from the output when the circuit is disabled. In normal operation, the transistors 502 and 508 are switched on and off in complementary fashion to drive the data output voltage DOUT. However, this configuration suffers from approximately 0.6 V or 0.7 V diode drop ($V_{DIODE}$ in FIG. 5) across the diode-connected transistors 504 and 506 during normal operation. As a result, the output signal level is reduced and the DOUT signal can reach only about +/−4.8 V for supply levels V+ and V− of +/−5.5 V.

The driver circuit 600 in FIG. 6 includes high side PMOS transistors 602 and 604 connected between the positive supply voltage V+ and the output, as well as NMOS transistors 606 and 608 connected between the driver output and the negative supply voltage V−. A protection circuit 610 includes a resistor R1 connected from the gate of transistor 606 to a signal ground and a Zener diode Z1 (e.g., Vz=6 V) is connected across the gate and source of the transistor 606. A PMOS transistor 612 and an NMOS transistor 614 are connected from the sources of the transistors 606 and 608 to the signal ground. The gate of transistor 608 is connected to the drains of the transistors 612 and 614. A second Zener diode Z2 (e.g., Vz=6 V) is connected between the gate and source of the transistor 612 and a second resistor R2 is connected from the gate of the transistor 614 to the signal ground. The high side protection circuit 601 in this example includes complementary protection circuitry including resistors, transistors and Zener diodes (not shown).

When the circuit 600 is enabled for normal operation, a disable signal DIS is at the negative supply voltage V− to turn on the transistor 614 and pull the gate of the transistor 608 to the signal ground voltage. This turns on the lower transistor 608 to allow the transistor 606 to selectively connect the output node to the negative supply voltage V− according to the NDRV signal. The upper transistor 602 is similarly turned on in normal operation to allow the transistor 604 to selectively connect the output to the positive supply voltage V+ according to a data drive signal PDRV. In normal operation, moreover, the transistors 602 and 608 are turned on and act as pass transistors. As a result, the driver circuit 600 in FIG. 5 avoids the diode voltage drop problem of the circuit 500 in FIG. 5 in normal operation.

When the circuit 600 is disabled, the DIS signal and the supply voltages V+ and V− are at the signal ground voltage. In this condition, the transistor 614 is turned off. If a large negative voltage is seen at the output node (e.g., −12 V), the Zener diode Z1 applies a positive gate-source voltage to the transistor 606 and this transistor 606 turns on. When the transistor 606 is on, the output node voltage is applied to the sources of the transistors 606 and 608. In this condition, the second Zener diode Z2 applies Vz voltage (e.g., 6 V) as a gate-source voltage to turn on the transistor 612, which applies the output node voltage to the gate of the lower transistor 608. The Zener diodes thus limit the gate-source voltages of the driver transistors 606 and 612 to around 6 V. Since the transistor 612 is turned on, the gate and source of the transistor 608 are shorted out. This allows use of transistors 606 and 608 designed to accommodate gate-source voltages of 7 V. The same is true of the upper transistors 602 and 604 using similar, complementary protection circuitry for the high side drive portion of the driver circuit 600. However, the protection circuitry 610 in FIG. 6 is a complex circuit using special components like Zener diodes. Zener diodes may not be available in all integrated circuit fabrication technologies.

In contrast to the circuit 600, the example driver circuits 101 in FIGS. 1-3 avoid the need for Zener diodes, and still provide leakage current limiting and voltage stress protection. The circuits 101 can accordingly be used across any fabrication technology. Moreover, the leakage current is significantly reduced (e.g., from uA to nA) as shown in the simulation results graph 400 of FIG. 4 above. The protection circuitry in FIGS. 1-3 thus provides reliable operation for significant output terminal voltage swings (e.g., +/−12 V) without the need for high voltage output transistors.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An output driver circuit, comprising:
   a high side switch circuit coupled between a first supply voltage node and an output node;
   a low side switch circuit, including a first low side transistor connected between the output node and a first intermediate node, and a second low side transistor connected between the first intermediate node and a second supply voltage node, the first low side transistor having a gate terminal;
   a control circuit, including an enable input, a data input, and a control output; and
   a protection circuit including:
   a resistor with a first terminal connected to the output node, and a second terminal connected to the gate terminal of the first low side transistor;
   a diode, having an anode connected to a second intermediate node, and a cathode connected to the gate terminal of the first low side transistor; and
   a switching device having an input coupled to the control output and being coupled between the second intermediate node and a reference voltage node.

2. The output driver circuit of claim 1, in which the switching device is a PMOS transistor, including:
   a drain connected to the second intermediate node; and
   a source connected to the reference node.

3. The output driver circuit of claim 2, in which the diode is a diode-connected transistor, including a source connected to the gate terminal of the first low side transistor, a gate connected to the second intermediate node, and a drain connected to the second intermediate node.

4. The output driver circuit of claim 2,
   in which the first low side transistor is a first NMOS transistor, including a source connected to the output node, a drain connected to the first intermediate node, and the gate terminal; and
   in which the second low side transistor is a second NMOS transistor, including a source connected to the second supply node, a drain connected to the first intermediate node, and a gate connected to receive a low side data signal from the control circuit.

5. The output driver circuit of claim 1, in which the diode is a diode-connected transistor, including a source connected to the gate terminal of the first low side transistor, a gate connected to the second intermediate node, and a drain connected to the second intermediate node.

6. The output driver circuit of claim 1,
   in which the first low side transistor is a first NMOS transistor, including a source connected to the output node, a drain connected to the first intermediate node, and the gate terminal; and
   in which the second low side transistor is a second NMOS transistor, including a source connected to the second supply node, a drain connected to the first intermediate node, and a gate connected to receive a low side data signal from the control circuit.

7. The output driver circuit of claim 1, in which the control output of the control circuit provides a control signal in a first state to turn on the switching device when an enable input signal is in a first state, and in which the control output of the control circuit provides the control signal in a second state to turn off the switching device when the enable input signal is in a second state.

8. A protection circuit comprising:
   a first output transistor coupled between an output node and a supply voltage node, the first transistor having a gate terminal;
   a resistor with a first terminal connected to the output node, and a second terminal connected to the gate terminal of the first output transistor;
   a diode, including an anode connected to a second intermediate node, and a cathode connected to the gate terminal of the first output transistor; and
   a switching device, including a control input and being coupled between the second intermediate node and a reference voltage node.

9. The protection circuit of claim 8, including a second output transistor connected between the first transistor and the supply voltage node.

10. The protection circuit of claim 9,
   in which the first output transistor is a first NMOS transistor, including a source connected to the output node, a drain connected to a first intermediate node, and the gate terminal; and
   in which the second output transistor is a second NMOS transistor, including a source connected to the supply voltage node, a drain connected to the first intermediate node, and a gate adapted to receive a data signal.

11. The protection circuit of claim 10, in which the diode is a diode-connected transistor, including a source connected to the gate terminal of the first output transistor, a gate connected to the second intermediate node, and a drain connected to the second intermediate node.

12. The protection circuit of claim 11, in which the switching device is a PMOS transistor, including a drain connected to the second intermediate node, a source connected to the reference node, and a gate connected to the control input.

13. The protection circuit of claim 10, in which the switching device is a PMOS transistor, including a drain connected to the second intermediate node, a source connected to the reference node, and a gate connected to the control input.

14. The protection circuit of claim 8,
in which the first output transistor is a first NMOS transistor, including a source connected to the output node, a drain connected to the first intermediate node, and the gate terminal; and
in which the second output transistor is a second NMOS transistor, including a source connected to the supply voltage node, a drain connected to the first intermediate node, and a gate adapted to receive a data signal.

15. The protection circuit of claim 8, in which the diode is a diode-connected transistor, including a source connected to the gate terminal of the first output transistor, a gate connected to the second intermediate node, and a drain connected to the second intermediate node.

16. The protection circuit of claim 8, in which the switching device is a PMOS transistor, including a drain connected to the second intermediate node, a source connected to the reference node, and a gate connected to the control input.

17. An integrated circuit (IC), comprising:
an enable input terminal;
a data input terminal;
a data output terminal;
a high side switch circuit coupled between the output terminal and a first supply voltage node and having control input;
a low side switch circuit coupled between the output terminal and a second supply voltage node, the low side switch circuit including an output transistor having a gate being coupled between the data output terminal and a supply voltage node;
a control circuit having an input coupled to the enable input terminal, an input coupled to the data input terminal, and a control output coupled to the control input; and
a protection including:
a resistor with a first terminal connected to the data output terminal, and a second terminal connected to the gate terminal of the output transistor;
a diode, including an anode connected to a second intermediate node, and a cathode connected to the gate terminal of the output transistor; and
a switching device having a control input coupled to the control output and being coupled between the second intermediate node and the supply voltage node.

18. The IC of claim 17, in which the low side switch circuit includes a second low side transistor connected between the output transistor and the supply voltage node.

19. The IC of claim 18, wherein the switching device is a PMOS transistor, including:
a drain connected to the second intermediate node; and
a source connected to the supply voltage node.

* * * * *